(12) United States Patent
Mess et al.

(10) Patent No.: US 7,998,792 B2
(45) Date of Patent: *Aug. 16, 2011

(54) SEMICONDUCTOR DEVICE ASSEMBLIES, ELECTRONIC DEVICES INCLUDING THE SAME AND ASSEMBLY METHODS

(75) Inventors: Leonard E. Mess, Boise, ID (US); Jerry M. Brooks, Caldwell, ID (US); David J. Corisis, Nampa, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/631,296

(22) Filed: Dec. 4, 2009

(65) Prior Publication Data

US 2010/0078793 A1    Apr. 1, 2010

Related U.S. Application Data

(60) Continuation of application No. 12/510,045, filed on Jul. 27, 2009, which is a continuation of application No. 11/599,223, filed on Nov. 13, 2006, now Pat. No. 7,704,794, which is a division of application No. 10/933,059, filed on Sep. 1, 2004, now Pat. No. 7,375,419, which is a continuation of application No. 09/886,593, filed on Jun. 21, 2001, now Pat. No. 6,900,528.

(51) Int. Cl.
    *H01L 21/00* (2006.01)
(52) U.S. Cl. . 438/112; 430/108; 430/109; 257/E21.705; 257/E25.013
(58) Field of Classification Search ............... 438/108, 438/109, 112, 118, 127
    See application file for complete search history.

(56) References Cited

U.S. PATENT DOCUMENTS

| 5,012,323 | A | 4/1991 | Farnworth |
| 5,128,831 | A | 7/1992 | Fox, III et al. |
| 5,147,815 | A | 9/1992 | Casto |
| 5,291,061 | A | 3/1994 | Ball |
| 5,323,060 | A | 6/1994 | Fogal et al. |
| 5,399,898 | A | 3/1995 | Rostoker |
| 5,422,435 | A | 6/1995 | Takiar et al. |
| 5,434,745 | A | 7/1995 | Shokrgozar et al. |
| 5,478,781 | A | 12/1995 | Bertin et al. |
| 5,483,024 | A | 1/1996 | Russell et al. |
| 5,530,287 | A | 6/1996 | Currie et al. |
| 5,585,668 | A | 12/1996 | Burns |

(Continued)

FOREIGN PATENT DOCUMENTS

JP              56158467            12/1981

(Continued)

*Primary Examiner* — Fernando L Toledo
(74) *Attorney, Agent, or Firm* — Lerner, David, Littenberg, Krumholz & Mentlik, LLP

(57) ABSTRACT

A semiconductor device is formed of two or more dice of similar dimensions and bond pad arrangements, in which bond pads are located in fields along less than three edges of the active surface of each die. A first die is attached to a substrate and subsequent die or dice are attached in a vertical sequence atop the first die, each in an offset configuration from the next lower die to expose the bond pads thereof for conductive bonding to metallization of the substrate. The multiple chip device permits a plurality of dice to be stacked in a high-density low-profile device. A particularly useful application is the formation of stacked mass storage flash memory package.

32 Claims, 13 Drawing Sheets

U.S. PATENT DOCUMENTS

| | | | |
|---|---|---|---|
| 5,585,675 | A | 12/1996 | Knopf |
| 5,635,010 | A | 6/1997 | Pepe et al. |
| 5,689,135 | A | 11/1997 | Ball |
| 5,723,906 | A | 3/1998 | Rush |
| 5,793,108 | A | 8/1998 | Nakanishi et al. |
| 5,807,762 | A | 9/1998 | Akram et al. |
| 5,899,705 | A | 5/1999 | Akram |
| 5,952,725 | A | 9/1999 | Ball |
| 5,963,794 | A | 10/1999 | Fogal et al. |
| 5,973,403 | A | 10/1999 | Wark |
| 5,998,864 | A | 12/1999 | Khandros et al. |
| 6,051,878 | A | 4/2000 | Akram et al. |
| 6,051,886 | A | 4/2000 | Fogal et al. |
| 6,252,305 | B1 | 6/2001 | Lin et al. |
| 6,359,340 | B1 | 3/2002 | Lin et al. |
| 6,376,904 | B1 | 4/2002 | Haba et al. |
| 6,376,914 | B2 | 4/2002 | Kovats et al. |
| 6,461,897 | B2 | 10/2002 | Lin et al. |
| 6,552,423 | B2 | 4/2003 | Song et al. |
| 6,580,035 | B1 | 6/2003 | Chung |
| 6,621,155 | B1 | 9/2003 | Perino et al. |
| 6,784,019 | B2 | 8/2004 | Huang |
| 6,885,106 | B1 | 4/2005 | Damberg et al. |
| 6,900,528 | B2 | 5/2005 | Mess et al. |
| 7,262,506 | B2 | 8/2007 | Mess et al. |
| 7,375,419 | B2 | 5/2008 | Mess et al. |
| 7,704,794 | B2 * | 4/2010 | Mess et al. .................. 438/112 |
| 2001/0015485 | A1 | 8/2001 | Song et al. |
| 2003/0137042 | A1 | 7/2003 | Mess et al. |
| 2007/0065987 | A1 | 3/2007 | Mess et al. |
| 2008/0001266 | A1 | 1/2008 | Yu et al. |
| 2008/0001303 | A1 | 1/2008 | Yu et al. |
| 2008/0296748 | A1 | 12/2008 | Haba et al. |
| 2008/0303131 | A1 | 12/2008 | McElrea et al. |
| 2009/0065948 | A1 | 3/2009 | Wang |
| 2009/0140440 | A1 | 6/2009 | Liu et al. |
| 2010/0055836 | A1 | 3/2010 | Yu et al. |
| 2010/0193930 | A1 | 8/2010 | Lee |

FOREIGN PATENT DOCUMENTS

| | | |
|---|---|---|
| JP | 628534 | 1/1987 |
| JP | 63104343 | 5/1988 |
| JP | 3165550 | 7/1991 |
| JP | 513665 | 1/1993 |

* cited by examiner

SEMICONDUCTOR DEVICE ASSEMBLIES, ELECTRONIC DEVICES INCLUDING THE SAME AND ASSEMBLY METHODS

CROSS-REFERENCE TO RELATED APPLICATIONS

This application is a continuation of U.S. patent application Ser. No. 12/510,045, filed Jul. 27, 2009, pending, which application is a continuation of U.S. patent application Ser. No. 11/599,223, filed Nov. 13, 2006, pending, which is a divisional of U.S. patent application Ser. No. 10/933,059, filed Sep. 1, 2004, now U.S. Pat. No. 7,375,419, issued May 20, 2008, which is a continuation of U.S. patent application Ser. No. 09/886,593, filed Jun. 21, 2001, now U.S. Pat. No. 6,900,528, issued May 31, 2005, the disclosures of each of the which are hereby incorporated by reference in their entirety.

BACKGROUND OF THE INVENTION

1. Field of the Invention

This invention relates generally to packaged semiconductor devices. More particularly, the invention pertains to flash memory devices having high memory density.

2. State of the Art

The use of semiconductor integrated circuit (IC) chips is widespread, in both commercial grade and specific high reliability applications. Continuing progress in the manufacture of IC chips has resulted in chips of greatly increased density, i.e., higher number of devices per footprint area of each chip. In addition, to produce increasingly complex electronic components, it is necessary to include a much greater number of IC chips on a substrate, e.g., a circuit board. One solution to this dilemma is to form a stack of chips on a substrate, creating what is known in the art as a multi-chip package.

The state of the art in vertically stacked multi-chip module (MCM) devices is illustrated by representative prior art devices shown in drawing FIGS. 1 through 11.

A representative example of a known multi-chip module semiconductor device 10, prior to packaging, is shown in drawing FIG. 1.

A plurality of chips or dice 12A, 12B and 12C (identified as dice 12) are mounted in a pyramidal stack on a substrate 14. Each die is mounted with an adhesive material 16 to the next lower die or substrate and is electrically connected to the substrate 14 by bond wires 18 using known wire bonding methods. Variants of this multi-chip configuration are described in U.S. Pat. No. 5,422,435 to Takiar et al., Japan Patent 62-8534(A) to Tsukahara and Japan Patent 3-165550 (A) to Yashiro. In each of these references, a pyramidal stack is formed of increasingly smaller chips or dice 12, in order to accommodate the placement of bond wires 18 on peripheral portions of each die 12. This configuration is not generally useful where dice of equal dimensions are to be placed in a multi-chip module (MCM), such as in a memory device.

In drawing FIG. 2, a pyramidal stack of chips in device 10 is shown as described in U.S. Pat. No. 5,399,898 to Rostoker. In these references, the dice 12A, 12B, 12C comprise "flip-chips" with solder bumps or balls 20 joined to conductive areas on the back side 22 of the underlying flip-chip.

Depicted in drawing FIG. 3 is an MCM device 10 in which a first die 12A is attached to a substrate 14 with adhesive material 16 and is electrically connected to the substrate 14 with bond wires 18. A second die 12B is stacked atop the first die 12A and connected to it by solder balls 20. The second die 12B is smaller than the first die 12A, in order to leave access to the first die's 12A conductive areas. This type of arrangement is depicted in Japan Patent 56-158467(A) to Tsubouchi, and a variant thereof is described in Japan Patent 63-104343 to Kuranaga.

Depicted in drawing FIG. 4 is an MCM device 10 formed of dice 12A and 12D mounted on opposite surfaces of a substrate 14. In this example, the substrate 14 is a lead frame, and the construction permits both of the dice 12A, 12D to be connected to a metallization on one surface of the lead frame. This construction is described in U.S. Pat. No. 5,012,323 to Farnworth.

Each of the above stacking configurations requires that the dice be of differing sizes. This is mandated by the need to leave the bond pads of each die unobstructed for wire attachment.

There have been various configurations of MCM devices in which chips of equal dimensions are stacked. Several such configurations are shown in drawing FIGS. 5, 6, 7, 8, 9, 10 and 11 and described below.

In one MCM device configuration shown in U.S. Pat. No. 5,973,403 to Wark and Japan Patent 5-13665(A) to Yamauchi, a flip-chip die 12A is electrically bonded to a substrate 14 by posts, solder bumps or balls 20 or other connectors, and a second chip, i.e., die 12B, is attached back-to-back to the flip-chip die 12A (with an intervening insulation layer 24) and connected by bond wires 18 to the substrate 14. This particular MCM device 10 is illustrated in drawing FIG. 5.

In another form depicted in drawing FIG. 6, two dice 12A, 12B are mounted on opposite sides of a substrate 14, with intervening insulation layers 24. The dice 12A, 12B are shown with bond wires 18. This general dice-to-substrate configuration with variants is pictured in U.S. Pat. No. 5,147,815 to Casto, U.S. Pat. No. 5,689,135 to Ball, and U.S. Pat. No. 5,899,705 to Akram.

An MCM device 10 that combines various die configurations already described above in drawing FIGS. 1 through 6 is shown in U.S. Pat. No. 6,051,878 to Akram et al. The apparatus uses conductive column-like structures to connect substrates that carry the dice.

As shown in drawing FIG. 7, an MCM device 10 described in U.S. Pat. No. 5,483,024 to Russell et al. has two identical dice 12A, 12B with central bond pads. The dice are sandwiched between and attached to two lead frames 14A, 14B with discontinuous adhesive layers 16A and 16B. The dice 12A, 12B are joined by an intervening insulation layer 24. Bond wires 18 connect each die to the corresponding lead frame.

In drawing FIG. 8, a stacked MCM device 10 is depicted in accordance with the disclosure of U.S. Pat. No. 5,323,060 to Fogal et al. In this device, dice 12A, 12B, 12C, and 12D are vertically alternated with adhesive layers 16A, 16B and 16C. The thickness of the adhesive layers is enhanced to be greater than the bond wire loop height, so that bond wires 18 may be attached to the active surfaces of the dice, for connection to the substrate 14.

Described in U.S. Pat. No. 5,291,061 to Ball is a similar stacked device 10 in which the thickness of the adhesive layers 16A, 16B and 16C is reduced, using a low-loop-profile wire-bonding operation.

As shown in drawing FIG. 9, a device configuration generally shown in U.S. Pat. No. 5,399,898 to Rostoker uses an upper flip-chip die 12E to join dice 12A mounted on a substrate 14. The dice 12A are connected to substrate metallization with bond wires 18. Thus, the device 10 comprises three dice connected serially.

There are various forms of an MCM device in which separate enclosed units are first formed and then stacked. Examples are described in U.S. Pat. No. 5,434,745 to Shokrgozar et al. and U.S. Pat. No. 5,128,831 to Fox, III et al. A typical stacked device 10 of this construction is depicted in drawing FIG. 10, showing three units. Each unit comprises an intermediate substrate 15A with a metalized surface. A die 12A, 12B or 12C is mounted on the intermediate substrate 15A and connected to the metallization 30 by bond wires 18. A wall 32 surrounding each die 12 encloses the die 12, bond wires 18, and metallization 30. The various metallization leads extend to conductive columns 34 within the wall 32, the latter connected to metallization 40 on substrate 14. An insulative cover 38 protects the upper unit and forms a protective shell about the device.

In another design of MCM package device 10 shown in drawing FIG. 11, a plurality of dice 12A, 12B, . . . , have beveled edges 28 that permit the bonding of wires to edge bond pads on the active surfaces 26. This design requires that the die thickness 36 be sufficiently great to accommodate wire loop height in the beveled regions. If the die thickness 36 is insufficient, the thickness of adhesive material 16 must be increased. Thus, the device height will be increased. Also, the beveled edges 28 are weak and subject to breakage.

In each of the above prior art configurations for forming MCM devices containing a stack of identically configured dice, various limitations and/or problems exist as indicated above. A new device design is needed in which a plurality of identical dice with bond pads along one edge or two edges may be readily stacked for parallel operation. The new design must provide a device requiring fewer manufacturing steps and providing high density with enhanced reliability.

BRIEF SUMMARY OF THE INVENTION

In accordance with an embodiment, a semiconductor device is formed of two or more chips, i.e., dice, in which bond pads are located in areas along one or two edges of the active surface of each die. The device of the invention is particularly useful when configured to be formed of a stack of semiconductor dice that are substantially the same or similar in shape, size and bond pad arrangement. An example of this die configuration is a mass memory storage device with a row or rows of bond pads along one edge of the semiconductor die.

In a device of an embodiment, the dice are arranged in a stack in which each individual semiconductor die is positionally offset from the next lower semiconductor die, thus exposing the bond pads of each die for wire bonding or other conductor attachment. In some embodiments, a semiconductor die may overhang bond pads of an underlying semiconductor die, but the thickness of an intervening offset semiconductor die supporting the overhanging semiconductor die, together with two thin adhesive layers, provides sufficient "headroom" to accommodate the wire loop height. The thickness (Z-dimension) of adhesive layers may be minimized to reduce overall device height. Where bond pads are overhung by another die, wire bonding is successfully accomplished without the use of thick adhesive layers.

A substrate may be any body that supports the device, including, for example, a circuit board, a circuit card such as a multiple memory card, a lead frame or a tape automated bonding (TAB) tape. The bond pads of each die are exposed for rapid precise bond wiring to the substrate. In one embodiment, the apparatus is formed as a single stack of dice connected to a substrate whose reverse surface is configured for solder-ball bonding to another metalized surface.

In an embodiment, semiconductor dice having bond pads along one edge only need not be offset from each other in more than one direction. Semiconductor dice configured with bond pads along two adjacent edges are always offset from each other along two axes, i.e., in two directions. The offset exposes bond pads of a lower die to permit convenient wire bonding between each chip and a substrate.

Where the stack comprises more than two semiconductor dice, the offset of each semiconductor die may be positive or negative along both axes. The stack may include a reversal in the direction of offset. In this case, the die underlying the die having an offset direction change must also be rotated in orientation about a central Z-axis. The active surface of the semiconductor die may be rotated to place the bond pads adjacent a different location of the substrate. Such rotation may comprise zero, 90, 180 or 270 degrees in a clockwise or counter-clockwise direction.

Packaging of the device may use conventional processes for enclosing the semiconductor dice and conductors in a plastic, metal or ceramic encapsulant.

Some embodiments of the invention having up to four or more semiconductor dice provide complete exposure of all bond pads.

Use of this design provides adequate space for wire-bonding the bond pads that underlie die edges of a higher semiconductor die, because the spacer consists not of a thick adhesive layer, but an intervening die or a piece of silicon or similar material substantially the same size as the semiconductor die. In some instances, inoperative semiconductor dice may be used in the stack between operative semiconductor dice located on either side thereof. The designs of the stack and the substrate are coordinated to provide an easily formed device that may, for example, have a high memory density, minimal height, short bond wires, small footprint, and high speed and responsiveness. In one embodiment, the package is particularly useful as a high speed multi-die mass storage flash memory device with a high memory density.

BRIEF DESCRIPTION OF THE SEVERAL VIEWS OF THE DRAWINGS

FIGS. 17 through 24 are simplified side views of various exemplary embodiments of unencapsulated stacked multiple die devices having different configurations of one-axis die stacking and wire bonding, in which:

FIG. 17 is a side view of an offset stacked multiple die device having forwardly offset dice connected to a substrate, in accordance with the invention;

FIG. 18 is a side view of another embodiment of an offset stacked multiple die device having forwardly offset dice connected to a substrate, in accordance with the invention;

FIG. 19 is a side view of an offset stacked multiple die device having one rearwardly offset die and two forwardly offset dice connected to a substrate, in accordance with the invention;

FIG. 20 is a side view of another embodiment of an offset stacked multiple die device having one rearwardly offset die and two forwardly offset dice connected to a substrate, in accordance with the invention;

FIG. 21 is a side view of an offset stacked multiple die device having two rearwardly offset dice and one forwardly offset die connected to a substrate, in accordance with the invention;

FIG. 22 is a side view of another embodiment of an offset stacked multiple die device having two rearwardly offset dice and one forwardly offset die connected to a substrate, in accordance with the invention;

FIG. 23 is a side view of an offset stacked multiple die device having four dice with alternating forward and rearward offsets, connected to a substrate, in accordance with the invention;

FIG. 24 is a side view of another embodiment of an offset stacked multiple die device having four dice with alternating forward and rearward offsets, connected to a substrate, in accordance with the invention;

DETAILED DESCRIPTION OF THE INVENTION

Figure 1:
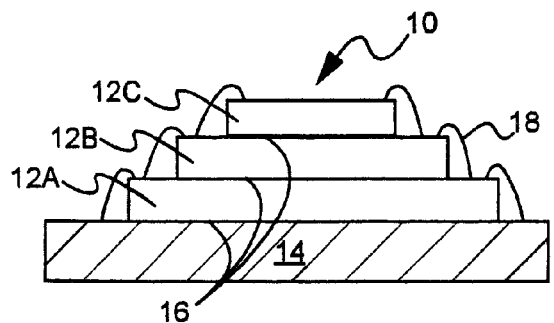
FIGS. 1 through 11 are side views of various prior art configurations of multi-chip module (MCM) devices.
Figure 3:
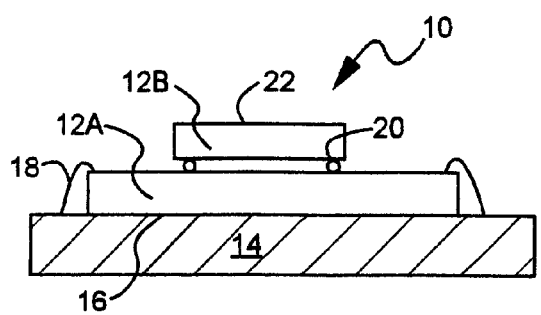
Figure 2:
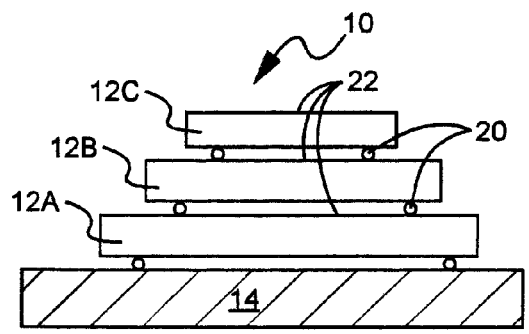
Figure 4:
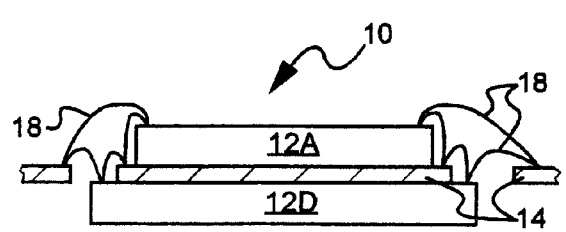
Figure 5:
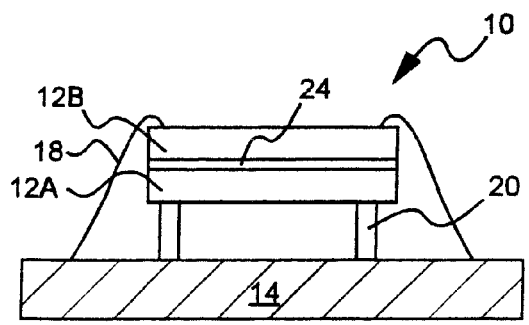
Figure 6:
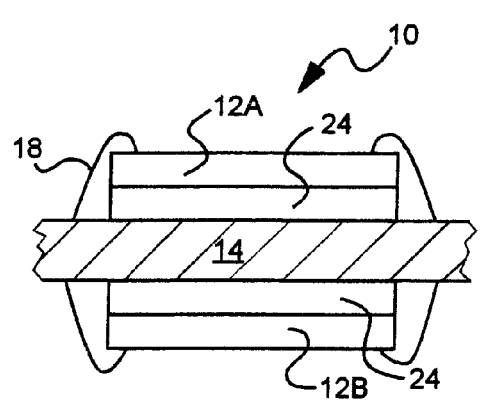
Figure 7:
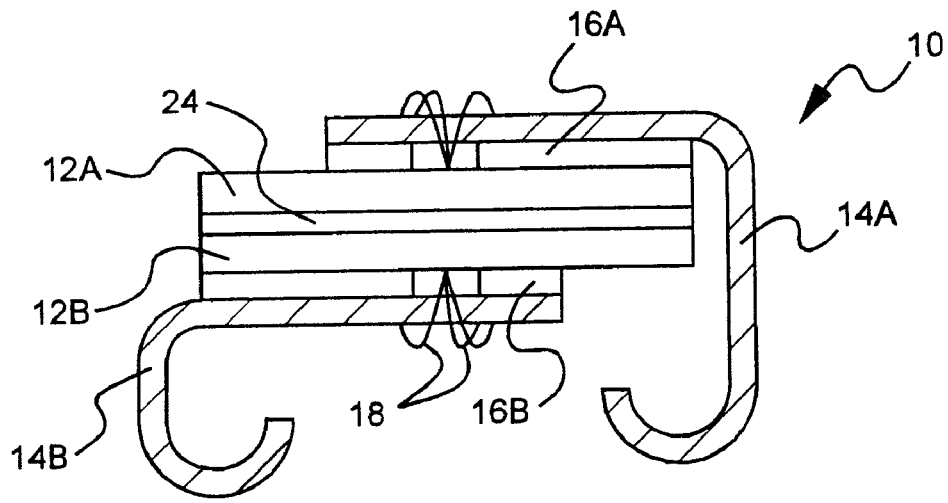
Figure 8:
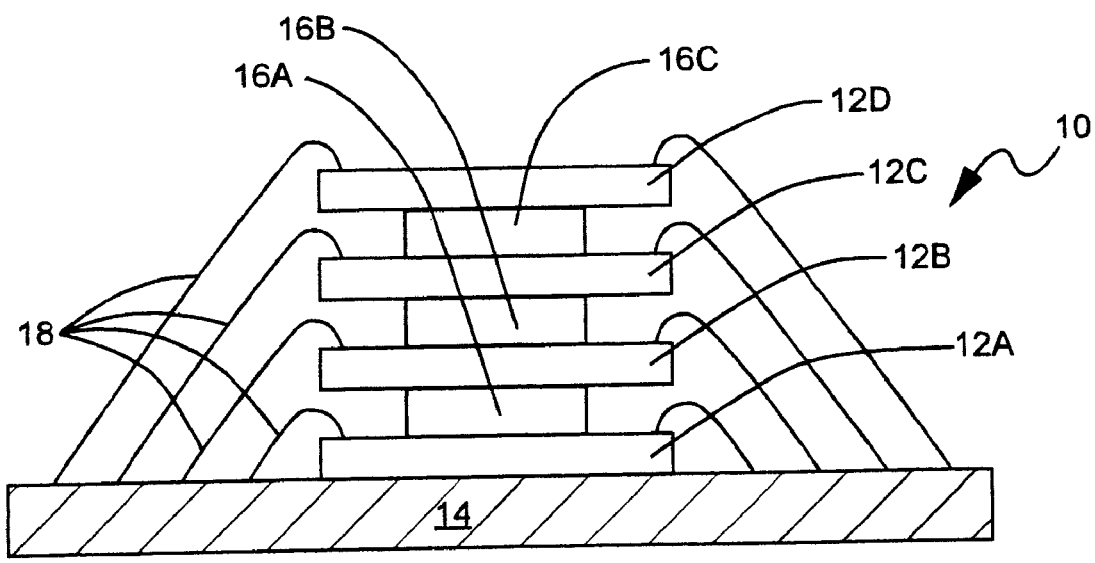
Figure 9:
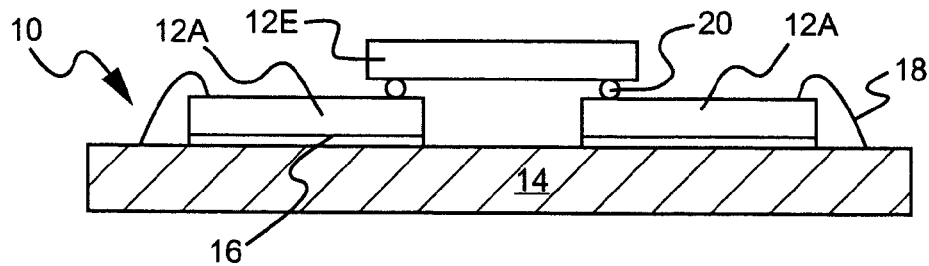
Figure 10:
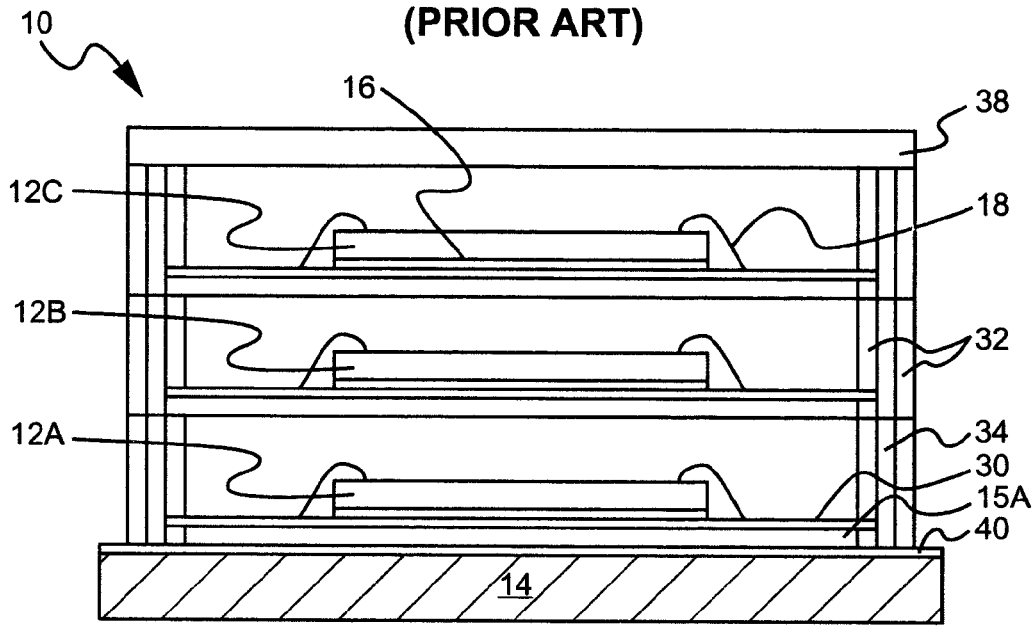
Figure 11:
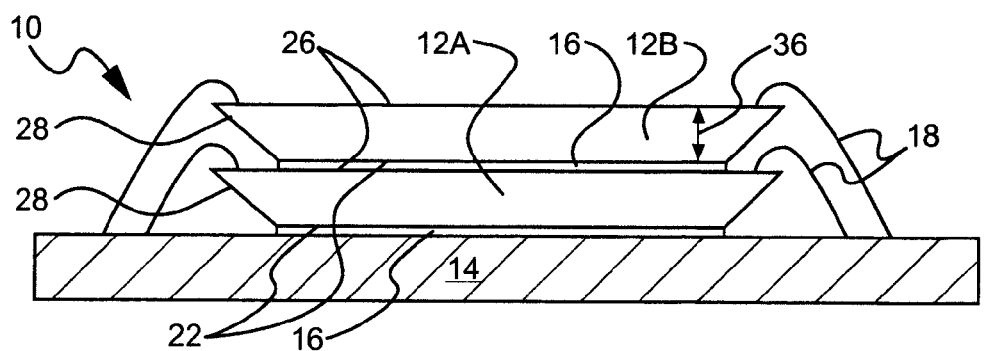

A new stacked multiple chip device formed of a plurality of offset Z-stacked, i.e., vertically stacked semiconductor dice, together with a method of production thereof are provided by the invention. Some devices of the invention may be classified as stacked multi-chip modules (MCM). Semiconductor dice that are particularly usefully stacked in this construction are those having conductive bond pads along one edge, or alternatively along two adjacent edges of the active surface. In addition, a particular embodiment will be described that utilizes elongated, i.e., semiconductor dice having bond pads along opposing distal edges of a nonsquare elongated active surface. Although the device is particularly adapted to dice of the same surface dimensions and similar bond pad layout, a stack of dice may be formed in accordance with this invention that includes one or more semiconductor dice of a differing configuration at either end of the stack, or interposed therein. The stack of semiconductor dice is physically attached to a substrate, in which the substrate may comprise, for example, a printed circuit board (PCB), a memory card, a lead frame, tape automated bonding (TAB) tape or other substrate. Additionally, similar shaped dummy dice of silicon and the like may be used as spacers between semiconductor dice in the stack.

In the figures and this description, semiconductor dice and any spacers in general will be denoted by the numeral 60, and a letter suffix i.e., A, B, C, etc., will be used to identify a particular semiconductor die or spacer or the like of a stack. Numerals identifying bond pads, bond wires, etc., that relate to a particular semiconductor die will carry the same suffix.

In this description, bond wires will be described as being connected between a semiconductor die and a substrate. It is to be understood that the wires are bonded to bond pads on the semiconductor die and to conductive members such as metallization or a lead frame, which may constitute all or part of the substrate. The device may also include semiconductor die-to-semiconductor die bonds.

With reference to the drawings of drawing FIGS. 12-12C, 13 and 14, which describe an embodiment of the instant invention, a semiconductor device 50 having a multi-chip module (MCM) type of configuration comprises two semiconductor dice 60A and 60B as a stack 61. This configuration is particularly appropriate to flash memory packages in which the die circuits are connected in parallel. In this configuration, the semiconductor dice 60A, 60B have essentially identical circuits and have upwardly facing active surfaces 52A, 52B with bond pads 54A, 54B along one edge 56A, 56B of each active surface, respectively. The bond pads of each semiconductor die 60 are collectively designated as a "field" 55 of bond pads. Each semiconductor die 60A, 60B has a length dimension 104 and a width dimension 106 that may be equal or unequal thereby making the semiconductor die 60A, 60B have different physical sizes and shapes.

Semiconductor die 60A is shown attached to a substrate 70 by adhesive layer 78. The adhesive layer 78 may be any adhesive capable of bonding a reverse surface 72 of a semiconductor die 60 to the active surface 52 of another semiconductor die or to a top side 66 of a substrate 70. Semiconductor die 60B is stacked on top of semiconductor die 60A and joined to it by thin adhesive layer 78. Semiconductor die 60B is offset from semiconductor die 60A along Y-axis 76 a distance 82, which exposes the field 55 of bond pads 54A. The offset distance 82 may be the shortest distance that permits reliable use of a wire bonding tool, not shown, to bond conductors such as bond wires 62 to the bond pads 54A. Thus, bond pads 54A, 54B are joined by fine metal bond wires 62 or other conductive members to conductive, e.g., metallization areas 58 on the top side 66 of substrate 70. If so dictated by the design of the device 50, certain bond pads 54A and 54B may also be conductively connected to each other, i.e., on the same semiconductor die 60A or 60B, or from semiconductor die 60A to semiconductor die 60B.

In these figures, the substrate 70 is pictured as a circuit board or memory card substrate or multimedia card substrate, for example. This example is shown with solder balls 64 on its reverse side 68 although other configurations of electrical connections may be used.

A controlled thickness thermoplastic or other type of adhesive may be used in adhesive layers 78 to join the semiconductor dice 60A and 60B to each other, and semiconductor die 60A to the substrate 70.

The bond pads 54A and 54B of semiconductor dice 60A and 60B, respectively, are joined to metallization or other conductive areas 58 on the substrate 70 by thin bond wires 62. Typically, the bond wires 62 have a diameter of about 0.001 inch and are formed of a metal such as aluminum or gold, or alloys thereof. The preferred method of bonding the bond wires 62 to the bond pads is known as ultrasonic ball bonding, which forms a low-loop wire bond that is less than the Z-dimension of a semiconductor die 60. Likewise, in a preferred method, ultrasonic "wedge" bonds of wire are formed at the substrate metallization area 58.

In general, semiconductor devices are encapsulated in a protective package to protect the die surfaces, metallization and wires from damage. As depicted in drawing FIGS. 12 through 14, edges of an exemplary equiangular encapsulating enclosure are defined by dashed lines 84. The encapsulant material may be a polymer, ceramic or other protective material. As shown, the completed, i.e., packaged device 50 may be formed to have a low-profile vertical (Z) dimension 86 (excluding solder balls 64) that is less than prior stacked device heights, because thick intervening layers of adhesive are not required between adjacent semiconductor dice 60.

Figure 12:
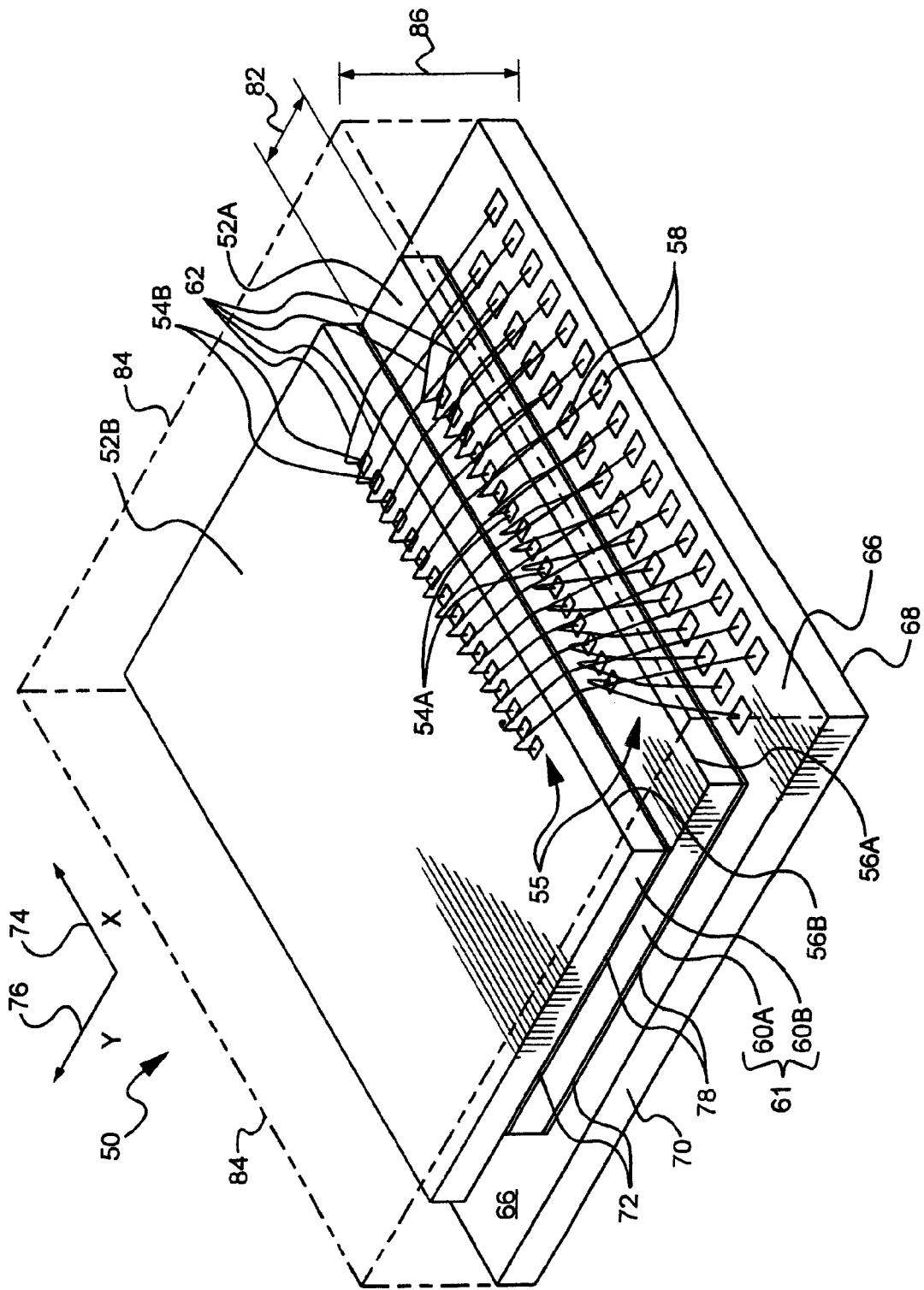
FIG. 12 is an isometric view of an offset stacked multiple die device with a single offset in accordance with the invention.
Figure 12A:
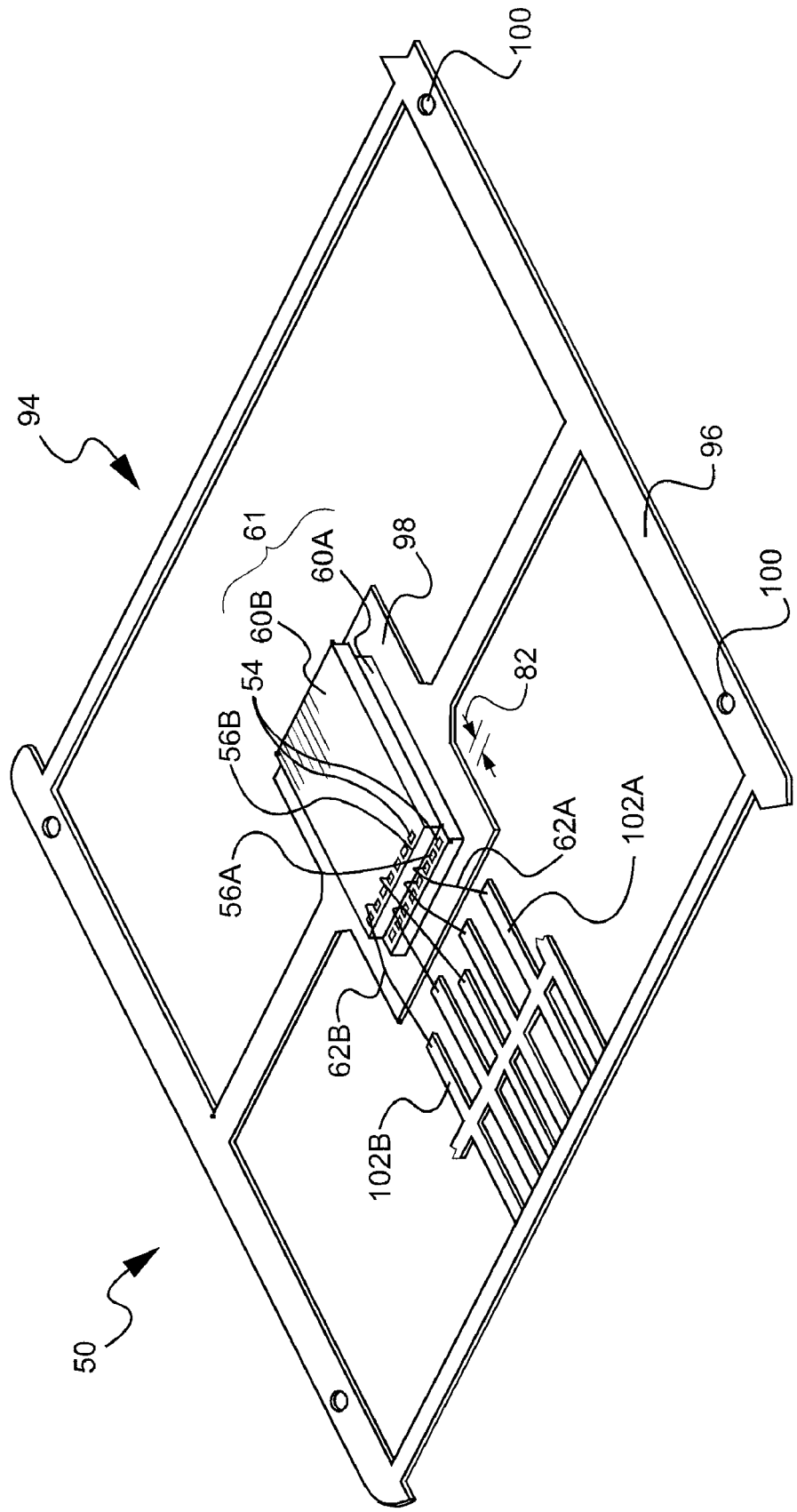
FIG. 12A is an isometric view of an offset stacked multiple die device with a single offset, mounted on a lead frame, in accordance with the invention.
Figure 12B:
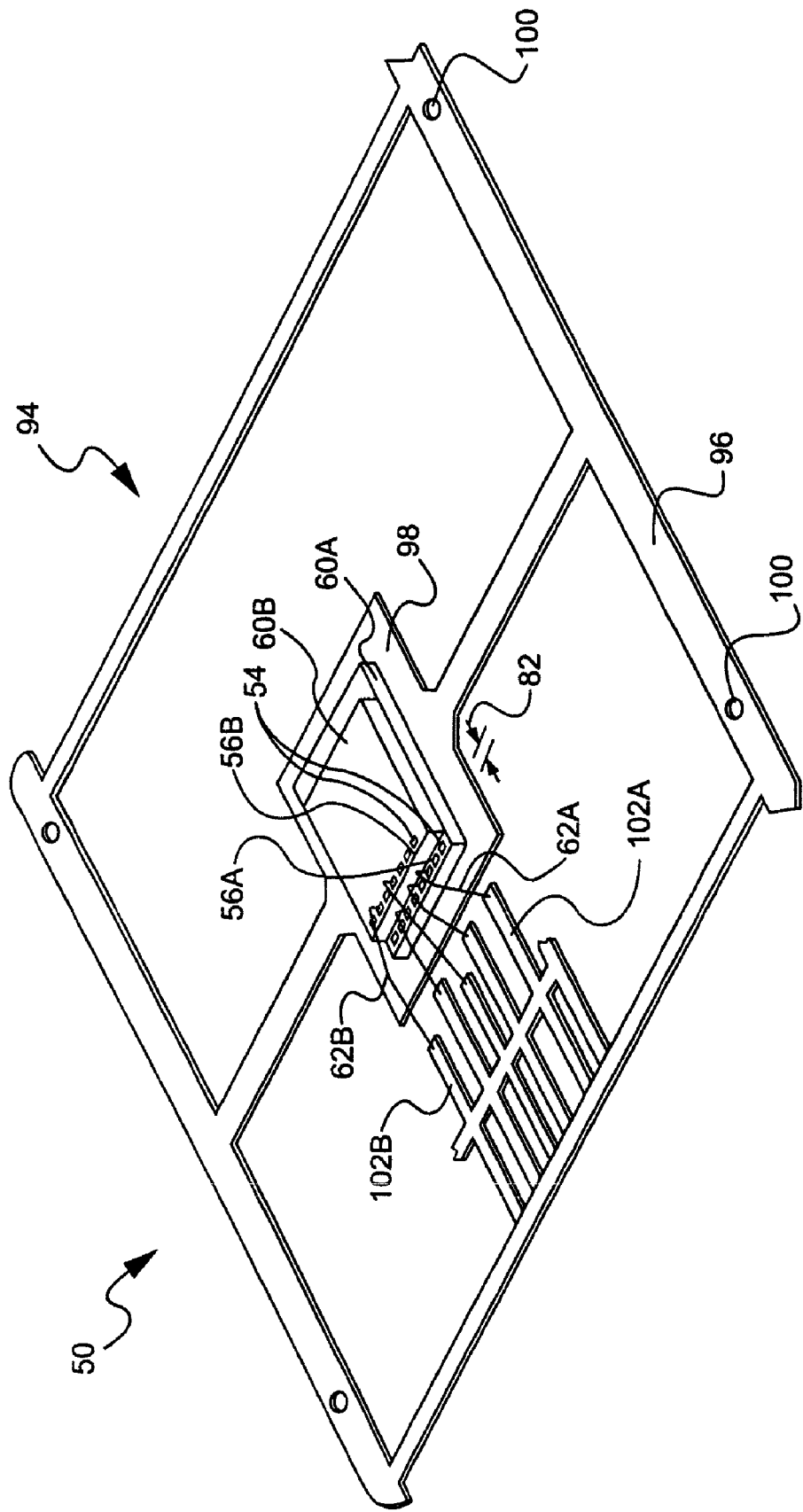
FIG. 12B is an isometric view of an offset stacked multiple die device with a single offset die of smaller size, mounted on a lead frame, in accordance with the invention.
Figure 12C:
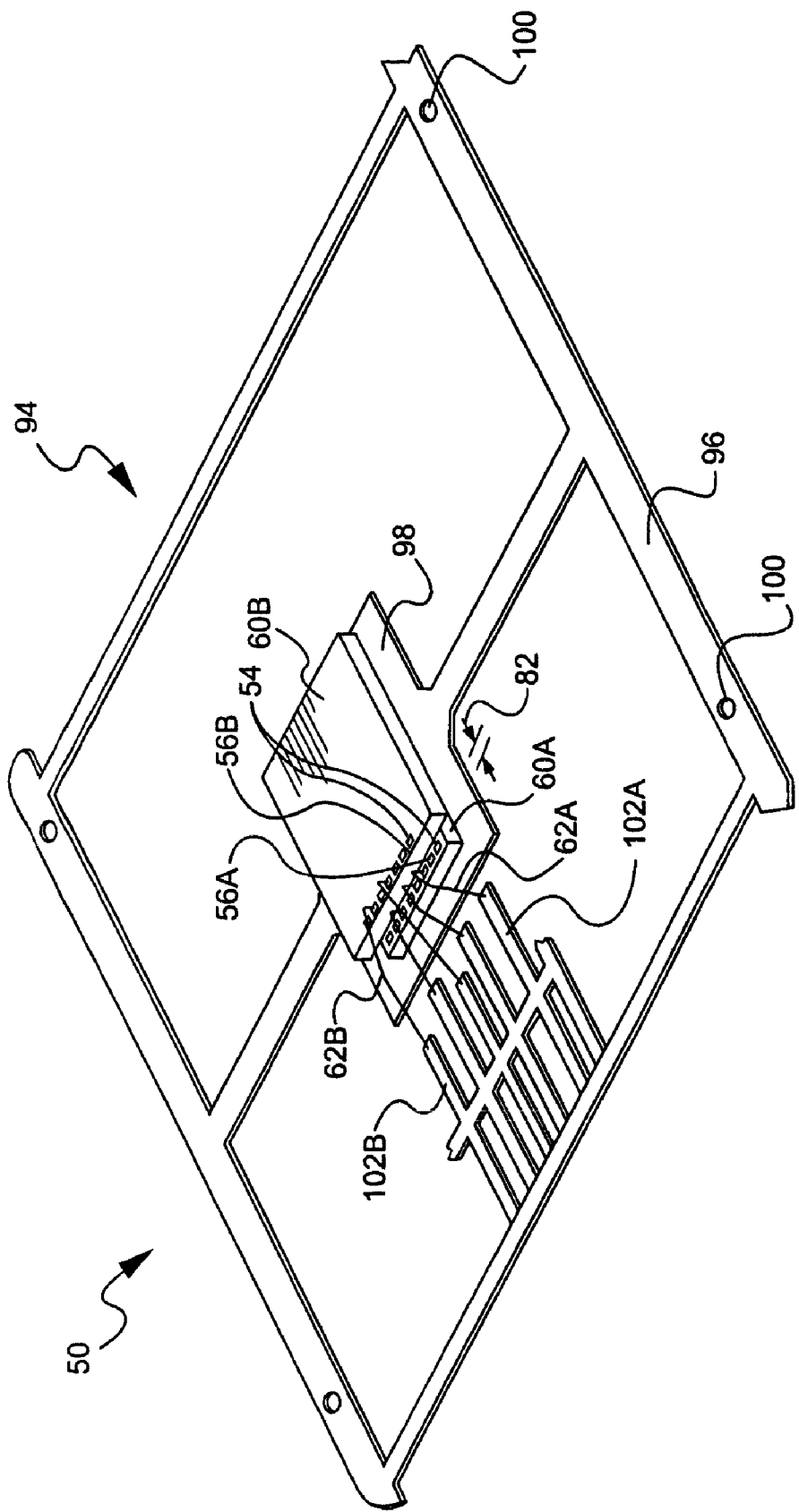
FIG. 12C is an isometric view of an offset stacked multiple die device with a single offset die of larger size, mounted on a lead frame, in accordance with the invention.

A stack 61 of two or more offset semiconductor dice 60 may also be formed on a lead frame 94, as depicted in an example in drawing FIG. 12A. The lead frame 94 is typically formed from a material such as copper, copper alloys, iron-nickel alloys, or the like. Other materials, such as TAB tape, could be used in accordance with this invention as well. The lead frame 94 is shown with opposing runners 96, a central paddle 98, and leads 102A and 102B to which wires are attached. The lead frame 94 has alignment mechanisms 100 such as precisely positioned marks or holes, for precise positioning of the lead frame 94 during operations such as die bonding and wire bonding where alignment is critical. In this example, semiconductor die 60A is attached to a paddle 98 of lead frame 94 with a thin adhesive layer, not shown. The paddle 98 serves as a substrate to support the stack 61. Semiconductor die 60B is then attached to overlie a major portion of semiconductor die 60A, wherein the die edge 56B along which bond pads 54 are positioned is offset a distance 82 from the die edge 56A of the lower semiconductor die 60A, to expose the bond pads 54. As shown, conductive bond wires 62A are connected from bond pads 54 of semiconductor die 60A to appropriate leads 102A. Likewise, bond wires 62B are connected from bond pads 54 to leads 102B. Alternatively, TAB bonding or other bonding methods may be used. As illustrated in drawing FIG. 12B, the semiconductor die 60B is of smaller size than that of semiconductor die 60A. Further, as illustrated in drawing FIG. 12C, the semiconductor die 60B is of larger size than semiconductor die 60A having three sides of the semiconductor die 60B overhanging the semiconductor die 60A.

Figure 13:
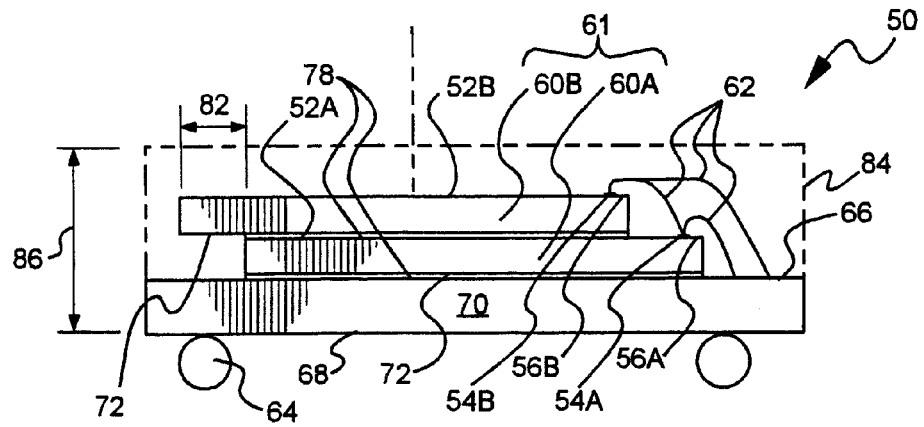
FIG. 13 is a side view of an offset stacked multiple die device with a single offset in accordance with the invention.
Figure 14:
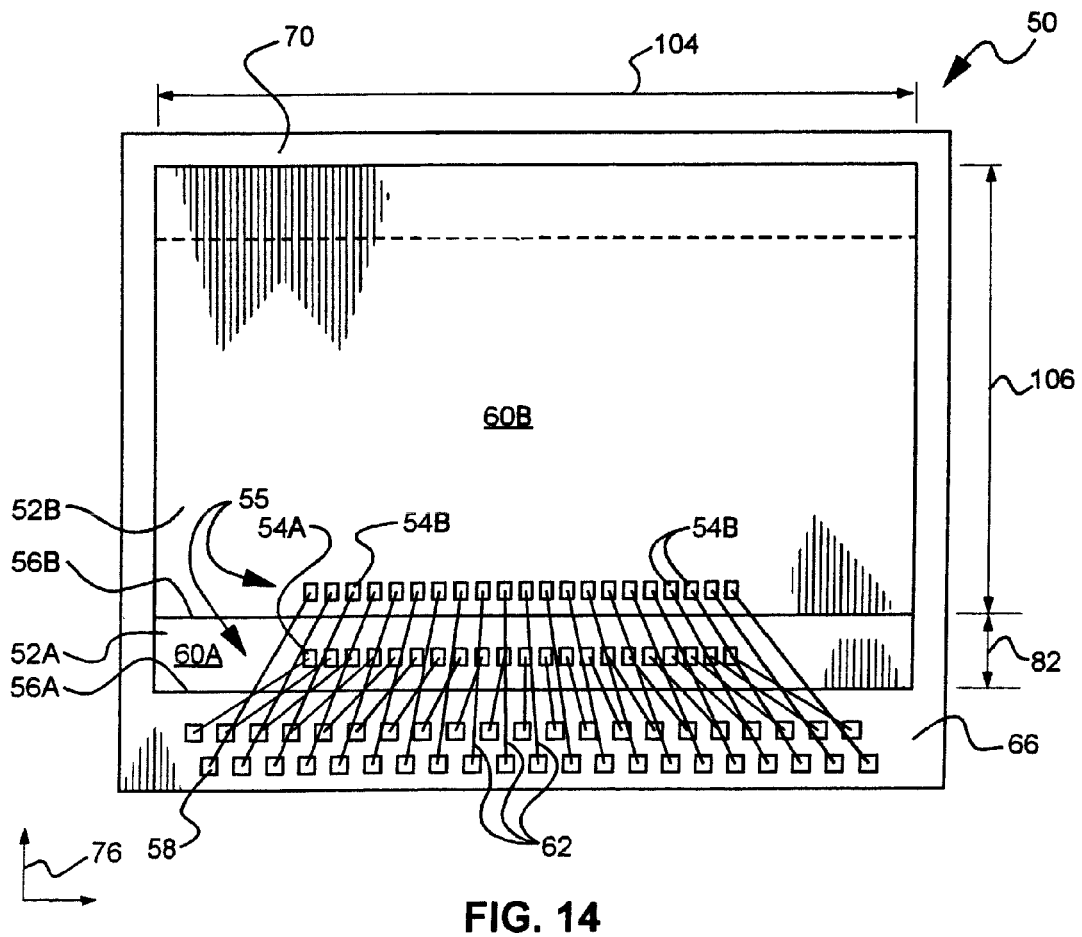
FIG. 14 is a plan view of an offset stacked multiple die device with a single offset in accordance with the invention.

In the embodiment of drawing FIGS. 12 through 14, both of the semiconductor dice 60A, 60B have their bond pads 54, 54A, 54B oriented in the same direction so that they are connected by bond wires 62 to metallization areas 58 on the same side of the device 50. However, semiconductor die orientation and other factors, such as semiconductor dice having different sizes and dimensions, may be changed to suit a particular application. Thus, major design factors affecting the stacked offset multiple semiconductor die device 50 include the number of semiconductor dice 60 in the stack 61, die dimensions, number of die edges 56 along which bond pads 54 are arrayed, offset direction(s), offset distance 82 and rotation angle of each semiconductor die 60 relative to the semiconductor die 60 just below.

Figure 15:
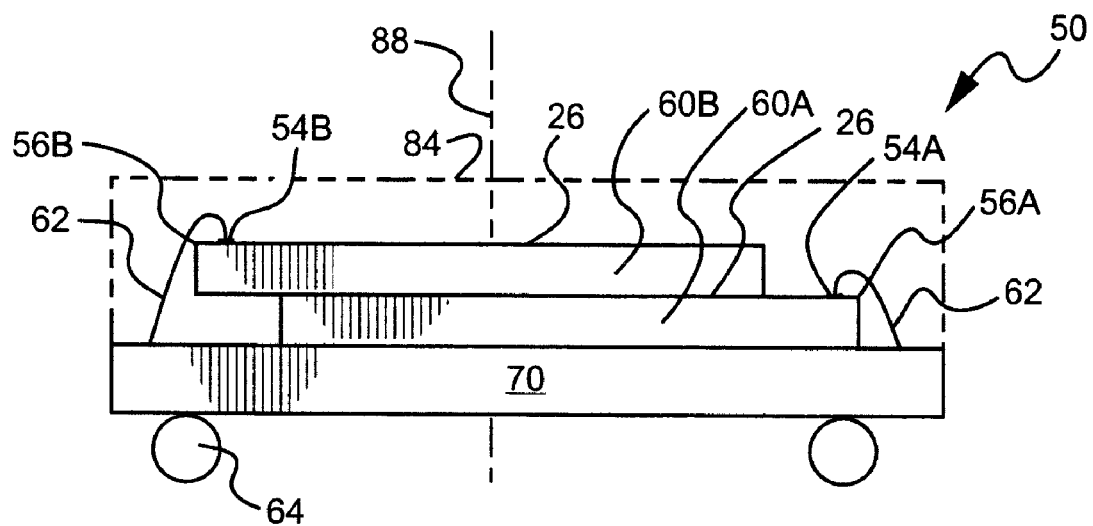
FIG. 15 is a side view of another embodiment of an offset stacked multiple die device in accordance with the invention.

As shown in drawing FIG. 15, semiconductor die 60B has been rotated 180 degrees about central Z-axis 88 (central Z-axis 88 also depicted in FIG. 13), such that its edge 56B along which bond pads 54B are positioned is opposite in direction to edge 56A of semiconductor die 60A. It is evident that semiconductor die 60B may alternatively be rotated zero degrees, 90 degrees, 180 degrees or 270 degrees relative to semiconductor die 60A. The conductive metallization area 58 on the substrate 70 must be configured for providing short bond wire connections with the bond pads 54A, 54B.

Figure 16:
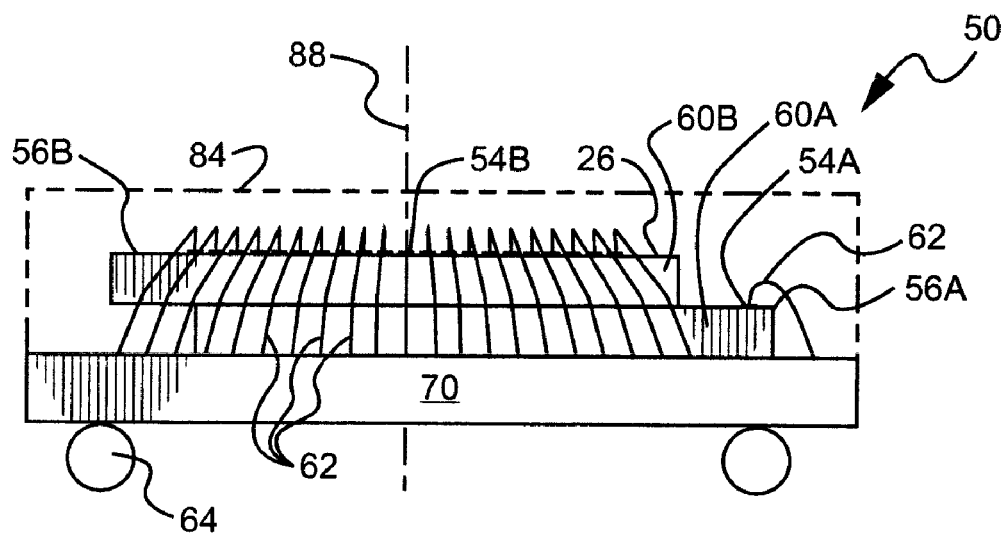
FIG. 16 is a side view of a further embodiment of an offset stacked multiple die device in accordance with the invention.

Depicted in drawing FIG. 16 is an offset stacked two-semiconductor die device 50 in which the upper semiconductor die 60B is rotated 90 degrees clockwise about Z-axis 88. Thus, the row(s) of bond pads 54B are rotated 90 degrees from the row(s) of bond pads 54A. In this embodiment, both semiconductor dice 60A, 60B are depicted as having active surfaces 26 that are substantially square but the device 50 may be formed of substantially nonsquare semiconductor dice.

As will be evident, a variety of offset stacking configurations is available when using semiconductor dice 60 with bond pads 54 along one edge 56. Depicted in drawing FIGS. 17 through 24 is a variety of such configurations; this application is not limited to these particular configurations, which serve as examples. Each of these figures relates to a stack 61 of four offset semiconductor dice 60A, 60B, 60C and 60D in which individual semiconductor die may be offset in a forward direction, i.e., to the right, or in a reverse direction, i.e., to the left. In addition, an individual semiconductor die 60 may be rotated 180 degrees so that the bond pad location is reversed relative to the underlying semiconductor die. Reversal of a semiconductor die 60 results in attachment of its bond pads 54 to substrate 70 in a different location.

For the sake of clarity, drawing FIGS. 17 through 24 do not show adhesive layers, encapsulating material or other details of the device 50. The number of semiconductor dice 60 comprising the stack 61 is limited only by design, construction and operational limitations such as materials strength, heat generation and dissipation, electric operability and the like. The design of the stack 61 must be coordinated with substrate design, i.e., to ensure accurate and rapid wire bonding and meet other design criteria.

Figure 17:
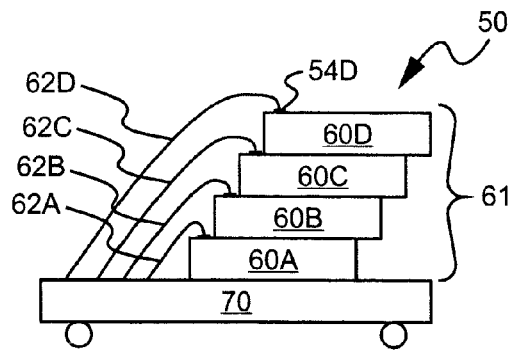

As shown in drawing FIG. 17, a plurality of semiconductor dice 60A, 60B, 60C and 60D may be consecutively stacked in a single offset direction, denoted herein as a "forward" direction. All of the semiconductor dice have bond pads 54 facing in the same direction. In this stacking configuration, the bond wires 62A, 62B, 62C or 62D of each semiconductor die is bonded to a substrate 70 at the same side of the stack 61.

Figure 18:
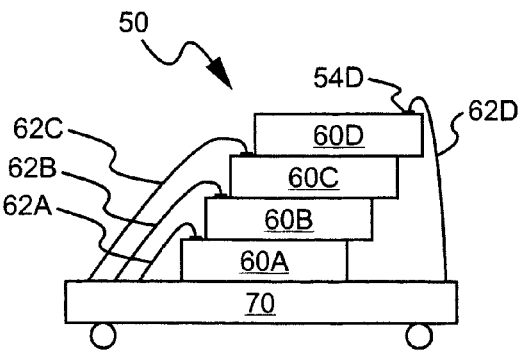

The embodiment of drawing FIG. 18 differs from drawing FIG. 17 in that the uppermost semiconductor die 60D is rotated 180 degrees relative to the other semiconductor dice 60A, 60B, 60C, and has bond pads 54D attached to the substrate 70 on the other side of the stack 61.

Illustrated in drawing FIGS. 19 through 24 are other offset multiple semiconductor die devices 50 in which semiconductor dice 60 are offset in both forward and reverse directions.

Figure 19:
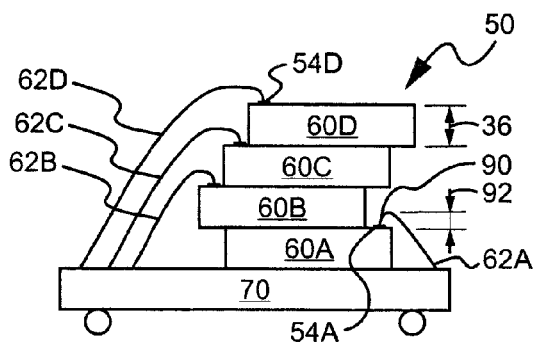
Figure 20:
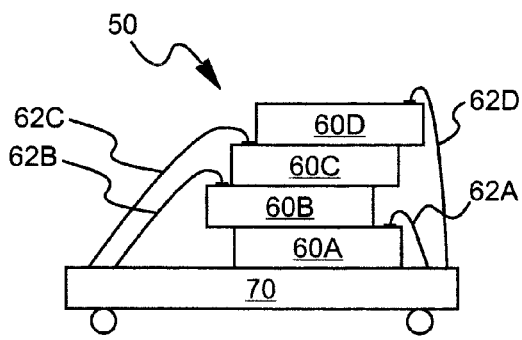

Illustrated in drawing FIGS. 19 and 20 are devices 50 that have a second semiconductor die 60B with a reverse offset and that is rotated 180 degrees relative to lowermost semiconductor die 60A. Semiconductor dice 60C and 60D are similarly rotated relative to semiconductor die 60A, and each is forwardly offset from its underlying die. In drawing FIG. 19, the bond wires 62 from the three upper semiconductor dice 60B, 60C and 60D are bonded to the substrate 70 on the same side of the stack 61, while semiconductor die 60A is bonded on the opposing side of the stack. In drawing FIG. 20, semiconductor die 60D is attached to the stack 61 in an unrotated position relative to semiconductor die 60A. Semiconductor die 60D has its bond wires 62D connected to substrate 70 in the vicinity of bond wires 62A, i.e., on the opposite side of the stack from bond wires 62B and 62C.

Figure 21:
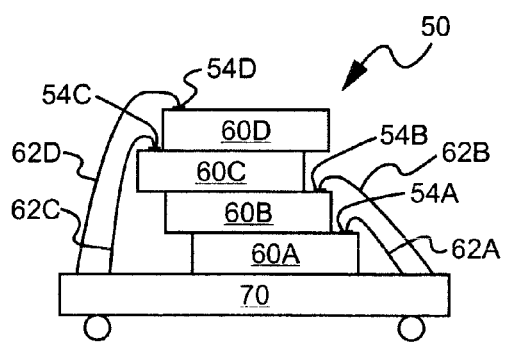
Figure 22:
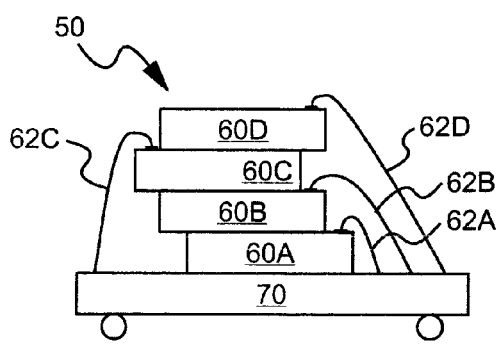

As illustrated in drawing FIGS. 21 and 22, semiconductor dice 60B and 60C are offset in a reverse direction from semiconductor die 60A, and semiconductor die 60D is offset in a positive direction from underlying semiconductor die 60C. Illustrated in drawing FIG. 21, semiconductor dice 60C and 60D are both rotated 180 degrees relative to semiconductor dice 60A and 60B, so that their bond pads 54C and 54D face in an opposite direction from bond pads 54A and 54B. Illustrated in drawing FIG. 22, semiconductor die 60D of the device 50 in drawing FIG. 21 has been rotated 180 degrees and its bond wires 62D attached to the substrate 70 in the vicinity of bond wires 62A and 62B.

Figure 23:
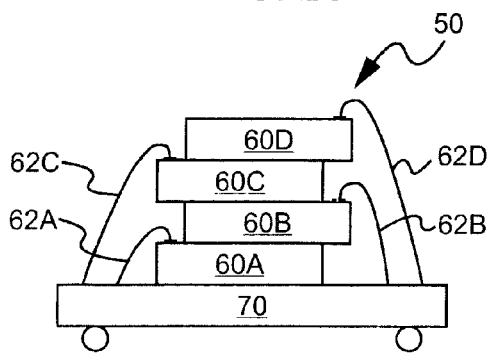

As shown in drawing FIG. 23, the semiconductor dice 60 in stack 61 may be ordered in an alternating fashion with respect to both die rotation, i.e., between a forward and reverse direction, and offset direction.

Figure 24:
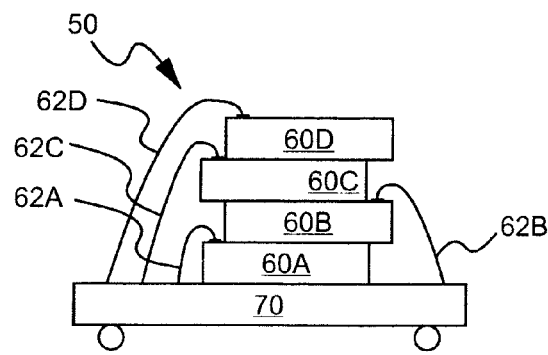

Alternatively, as shown in drawing FIG. 24, the uppermost semiconductor die 60D of a stack may have the same alternating offset pattern as the device 50 of drawing FIG. 23, but be rotated to have the same rotational orientation as its underlying semiconductor die 60C. The bond wires 62D will be joined to the substrate 70 in the vicinity of bond wires 62A and 62C.

Where the bond pads 54 of a semiconductor die 60 are overhung by a portion of another semiconductor die, those bond pads 54 may be wire-bonded to the substrate 70 prior to mounting the overhanging die in the stack 61. Using the configuration illustrated in drawing FIG. 19 as an example, it is seen that bond pads 54A are overhung by a portion of semiconductor die 60C. The height 92 of wire loop 90 is less than the die thickness 36, enabling wire bonding without subsequent contact of bond wires 62 with the overhanging semiconductor die 60C or intervening semiconductor die 60B or silicon spacer 60B.

Figure 25:
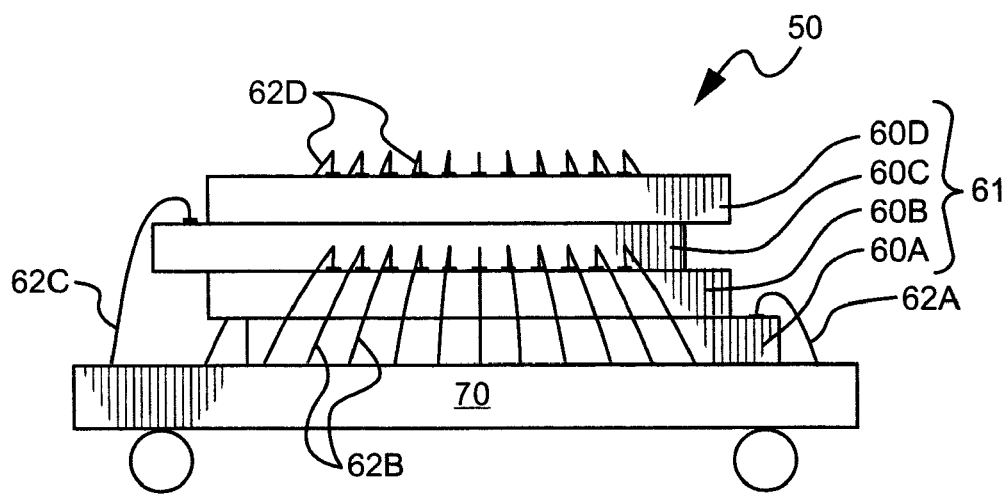
FIG. 25 is a side view of another embodiment of an offset stacked multiple die device having four dice that are sequentially rotated and offset in at least one direction.
Figure 26:
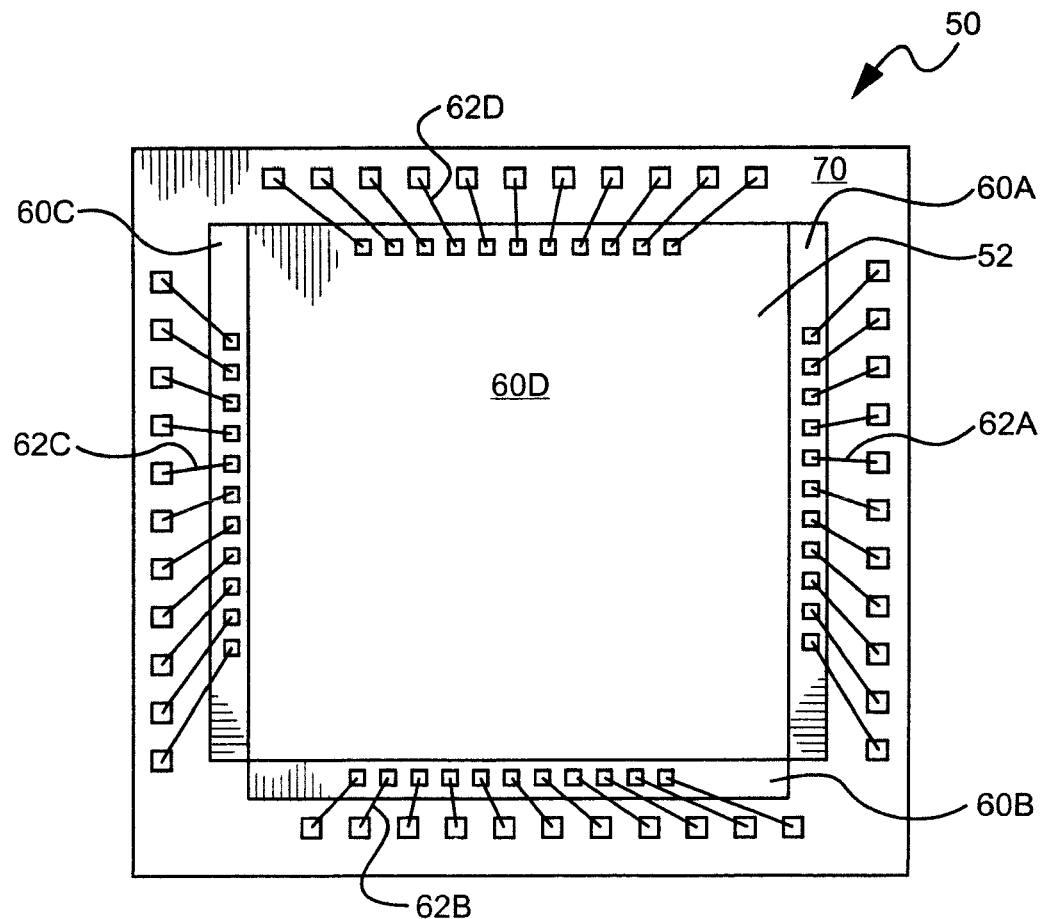
FIG. 26 is a plan view of an embodiment of an offset stacked multiple die device having four dice that are sequentially rotated and offset in at least one direction, in accordance with the invention.

Turning now to drawing FIGS. 25 and 26, another embodiment of an offset stacked device 50 is shown with a stack 61 of four semiconductor dice 60A, 60B, 60C and 60D. Each semiconductor die 60 has a square active surface 52 and all semiconductor dice 60 are constructed to be physically identical. By rotating each semiconductor die 60 to be 90 degrees from the next lower die, and offsetting each successive semiconductor die to avoid the bond pads 54 of the next lower semiconductor die, all bond pads 54 of the four semiconductor dice 60 are exposed for wire bonding in a single uninterrupted step.

The stacked offset multiple die device 50 of this invention may have any form of substrate 70 known in the art. For example, the substrate 70 may be a metalized lead frame as already shown in drawing FIG. 12A.

Figure 27:
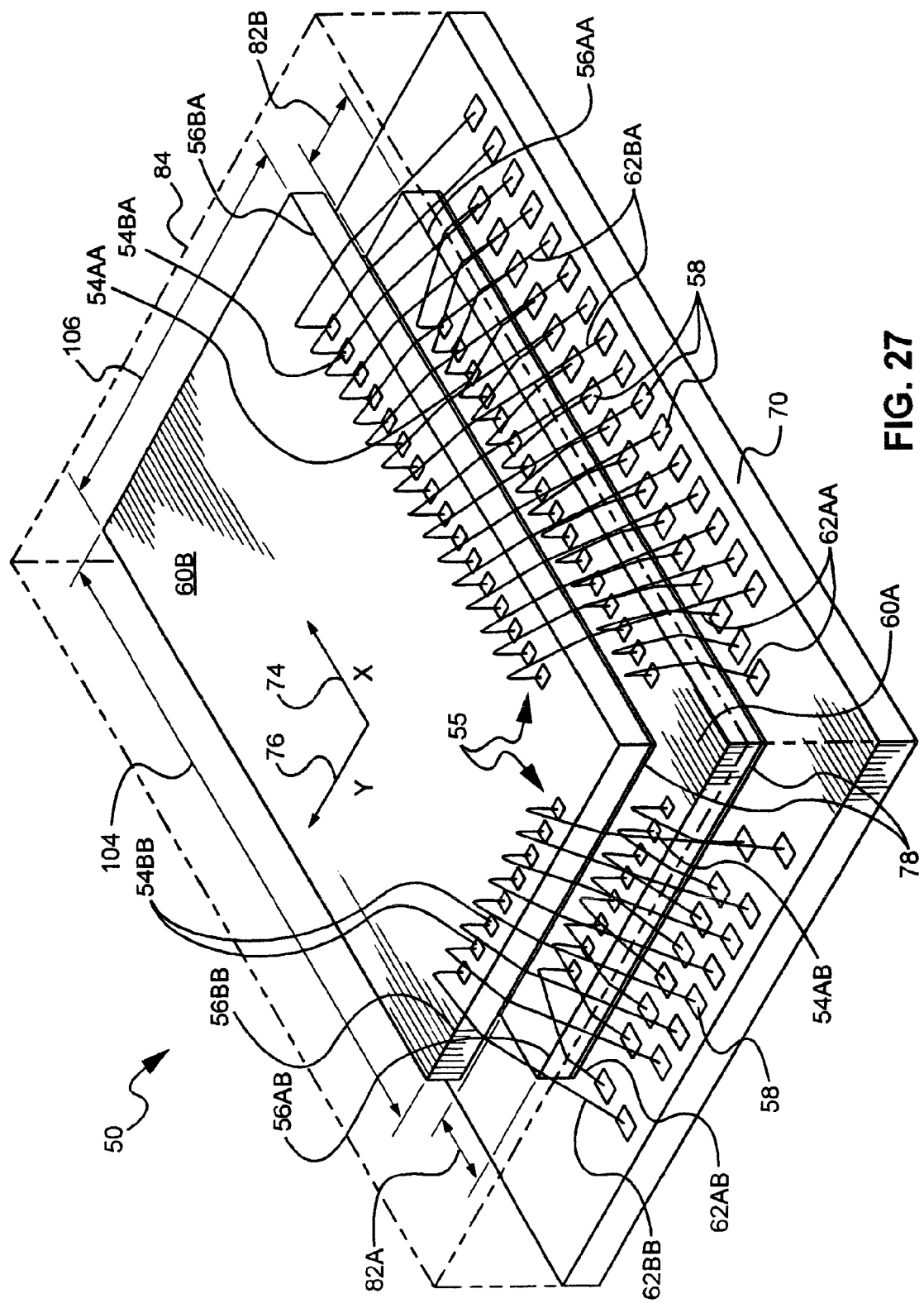
FIG. 27 is an isometric view of an offset stacked multiple die device formed of two dice with bond pads along two adjacent edges wherein an upper die is offset from an underlying die along both the X-axis and Y-axis in accordance with the invention.

Turning now to drawing FIG. 27, yet another embodiment of an offset stacked device 50 of the invention is shown that is formed of two or more semiconductor dice such as semiconductor dice 60A, 60B having conductive bond pads 54A and 54B, respectively. The two semiconductor dice 60A, 60B are joined together and to substrate 70 by thin adhesive layers 78. On each semiconductor die 60A and 60B, the bond pads 54A and 54B are shown as formed along two adjacent edges of the semiconductor die 60A and 60B. Thus, for example, semiconductor die 60A has bond pads 54AA formed along die edge 56AA, and bond pads 54AB formed along adjacent die edge 56AB. Likewise, semiconductor die 60B has bond pads 54BA formed along die edge 56BA. Semiconductor die 60B also has bond pads 54BB formed along die edges 56BB. Bond wires 62AA, 62BA, 62AB, 62BB connect substrate 70 to semiconductor dice 60A, 60B.

As shown in drawing FIG. 27, semiconductor die 60B is offset in position in two directions. Thus, semiconductor die 60B is offset from semiconductor die 60A a distance 82A along the X-axis 74 (X-axis 74 also depicted in FIG. 12) and a distance 82B along the Y-axis 76, whereby all of the bond pads 54AA and 54AB of semiconductor die 60A are exposed for easy wire bonding.

Additional semiconductor dice 60 may be mounted atop semiconductor die 60B. These semiconductor dice may be mounted in the same sequence, using a substrate 70 configured with metallization on two sides only of the stack 61. Alternatively, subsequent semiconductor dice 60C, . . . , may be mounted atop semiconductor die 60B having the same pattern of offset, i.e., along both the X-axis 74 and Y-axis 76, but rotated 180 degrees relative to semiconductor dice 60A and 60B. As a result, wire bonds will be made to the substrate 70 on four sides of stack 61.

Figure 28:
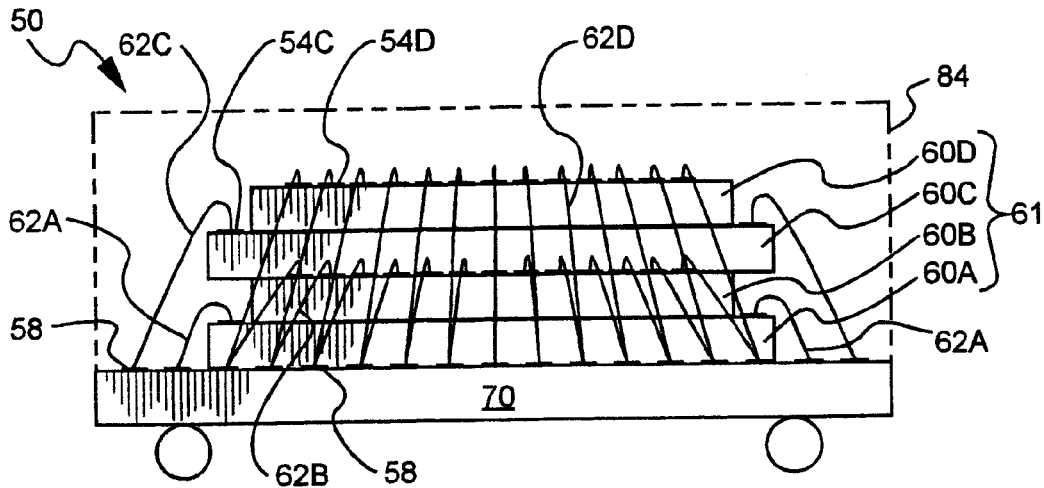
FIG. 28 is a side view of an offset stacked multiple die device formed of four elongated dice that have bond pads along two opposing edges wherein dice are arranged in an alternating sequence providing an offset from all dice, in accordance with the invention.
Figure 29:
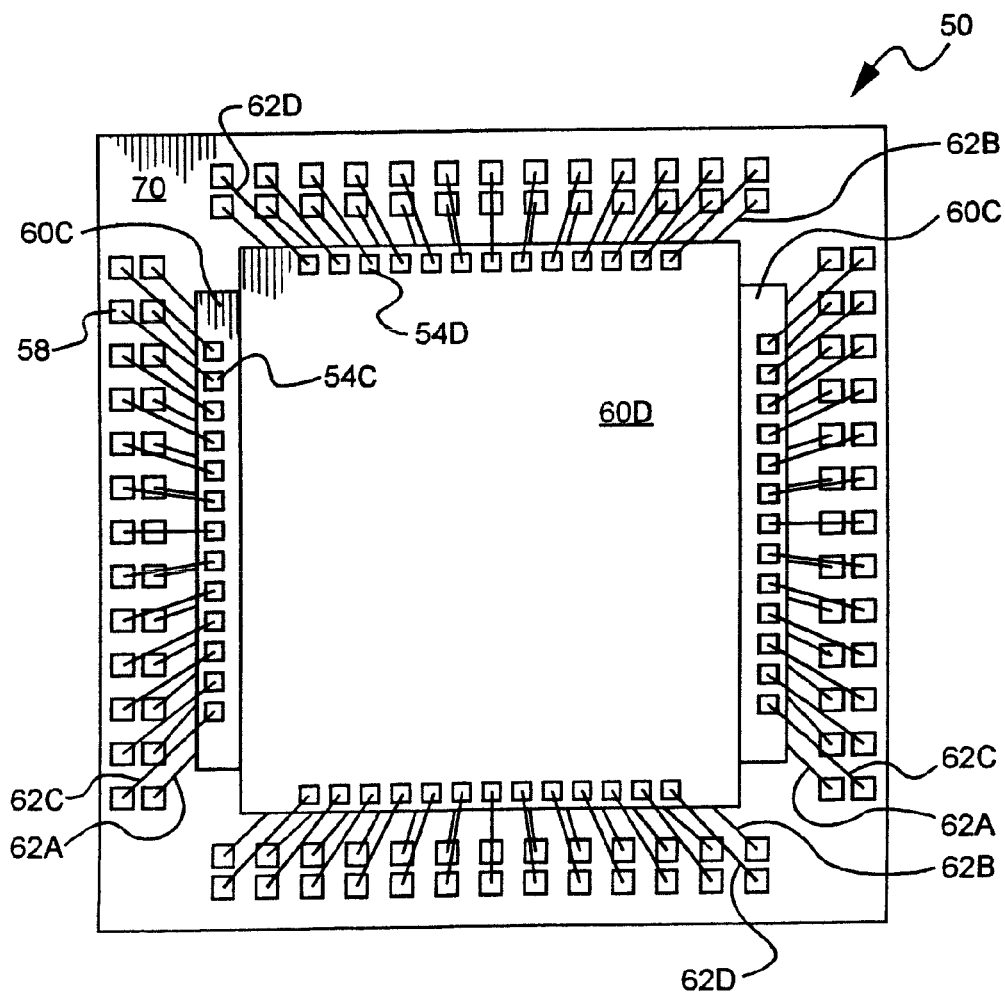
FIG. 29 is a plan view of an offset stacked multiple die device formed of four elongated dice that have bond pads along two opposing edges wherein dice are arranged in an alternating sequence providing an offset from all dice, in accordance with the invention.

A further embodiment of the invention is illustrated in drawing FIGS. 28 and 29, in which a semiconductor die stack 61 is formed of semiconductor dice 60 having bond pads 54 on each of two opposed edges 56 of the semiconductor die's active surface 52 (not shown). In this configuration, each added semiconductor die 60 is rotated 90 degrees or 270 degrees from the underlying semiconductor die to place the semiconductor die in an offset position. Each semiconductor die 60 has a length dimension 104 (see FIG. 27) that is longer than a width dimension 106 (see FIG. 27) by at least two times the required offset, i.e., to expose the bond pads 54 of the underlying semiconductor die. If desired, the semiconductor dice 60 can be of any convenient physical size and be of different physical size than the other. Use of more than two semiconductor dice 60 in the stack 61 results in semiconductor die bond pads 54 being overhung by a semiconductor die that is two positions higher in the stack. The manufacturing process will require intermediate wire bonding operations in this case. The stack configuration results in bond wires 62A and 62C to metallization areas 58 of the substrate 70 on two opposing sides of the stack 61, and bond wires 62B and 62D on the other two opposing sides of the stack. Thus, bond wires are located on all four sides of the stack 61.

As described herein, the invention provides a stacked multiple semiconductor die device or package of higher electronic density, in which individual die of similar size, different size, or the same size are offset from each other in the stack, enabling electrical attachment, e.g., wire bonding between the semiconductor dice and a substrate. Thus, the overall height of the stack of semiconductor dice, and the package formed therefrom, is minimal. Multiples of the stacked multiple die package may be combined in a large mass storage flash memory apparatus, for example.

The various embodiments of stacked offset multiple semiconductor die devices that are shown and described herein are exemplary and not limiting. It is understood that other configurations may include additional elements, for example, such elements including additional semiconductor dice and lead frames, heat sinks, dielectric layers, packaging, etc., as known in the art.

It is apparent to those skilled in the art that various changes and modifications may be made in the packaging methods and products of the invention as disclosed herein wthout departing from the spirit and scope of the invention as defined in the following claims.

What is claimed:

1. An electronic device component, comprising:
a carrier including:
contacts for establishing electrical communication with corresponding bond pads of one or more semiconductor devices;
a multi-chip stack secured to carrier and including:
at least two semiconductor devices in staggered arrangement with an upper semiconductor device superimposed partially over a lower semiconductor device, each of the upper and lower semiconductor devices including:
an active surface; and
bond pads carried by the active surface and located adjacent to a single peripheral edge of the semiconductor device; and
an intervening element between adjacent semiconductor devices of the at least two semiconductor devices and electrically isolating the adjacent semiconductor devices from one another,
the bond pads of the lower semiconductor device being exposed laterally beyond the single peripheral edge of the upper semiconductor device;
a plurality of intermediate conductive elements, including:
at least one first intermediate conductive element with:
a first end bonded to a bond pad of the bond pads adjacent to the single peripheral edge of the lower semiconductor device; and
a second end bonded to a first corresponding contact of the contacts of the carrier; and
at least one second intermediate conductive element with:
a first end bonded to a bond pad of the bond pads adjacent to the single penpheral edge of the upper semiconductor device; and
a second end bonded to a second corresponding contact of the contacts of the carrier;
at least one third intermediate conductive element with:
a first end bonded to a bond pad of the bond pads adjacent to the single peripheral edge of the lower semiconductor device; and
a second end bonded to a bond pad of the bond pads adjacent to the single peripheral edge of the upper semiconductor device;
a protective element over the multi-chip stack, the plurality of intermediate conductive elements, and at least a portion of the carrier; and
external conductive elements accessible from an exterior of the protective element and in communication with the contacts of the carrier for enabling communication between components external to the electronic device component and the at least two semiconductor devices of the multi-chip stack.

2. The electronic device component of claim 1, comprising a memory device.

3. The electronic device component of claim 1, wherein carrier comprises a circuit board including:
a substrate with a surface for receiving one or more semiconductor devices; and the contacts of the carrier comprise terminals on the surface of the substrate.

4. The electronic device component of claim 1, wherein the at least two semiconductor devices of the multi-chip stack are arranged in a shingle stack.

5. The electronic device component of claim 1, wherein the single peripheral edge and the bond pads that are adjacent to the single peripheral edge of the upper semiconductor device of the at least two semiconductor devices of the multi-chip stack are located laterally adjacent to the single peripheral edge and the bond pads that are adjacent to the single peripheral edge of the lower semiconductor device of the at least two semiconductor devices of the multi-chip stack.

6. The electronic device component of claim 5, wherein opposite edges of the upper semiconductor device of the at least two semiconductor devices of the multi-chip stack that are adjacent to each end of the single peripheral edge of the upper semiconductor device are aligned with opposite edges of the lower semiconductor device of the at least two semiconductor devices of the multi-chip stack that are adjacent to each end of the single peripheral edge of the lower semiconductor device.

7. The electronic device component of claim 1, wherein the intervening element of the multi-chip stack electrically isolates a back side of the upper semiconductor device from the active surface of the lower semiconductor device.

8. The electronic device component of claim 1, wherein the intervening element of the multi-chip stack adheres the upper semiconductor device to the lower semiconductor device.

9. The electronic device component of claim 1, wherein each intermediate conductive element of the plurality of intermediate conductive elements extends directly between a bond pad of the at least two semiconductor devices of the multi-chip stack and a corresponding contact of the carrier.

10. The electronic device component of claim 9, wherein the plurality of conductive elements comprise at least one of bond wires, conductive traces carried upon a flexible dielectric substrate, and leads.

11. The electronic device component of claim 1, further comprising:
an adhesive element securing the multi-chip stack to the carrier.

12. A semiconductor device assembly, comprising:
a carrier including a plurality of contacts;
a plurality of semiconductor devices, comprising:
a first semiconductor device with bond pads located adjacent to a single edge thereof; the first semiconductor device positioned over the carrier with the bond pads laterally adjacent to the plurality of contacts; and
a second semiconductor device with bond pads located adjacent to a single edge thereof, laterally adjacent to the bond pads of the first semiconductor device, the second semiconductor device superimposed partially over the first semiconductor device, with the bond pads adjacent to the single edge of the first semiconductor device being exposed laterally beyond the single edge of the second semiconductor device; and
a plurality of intermediate conductive elements, comprising:
at least one first intermediate conductive element extending directly between a bond pad of the first semiconductor device and a corresponding contact of the carrier;
at least one second intermediate conductive element extending directly between a bond pad of the second semiconductor device and a corresponding contact of the carrier; and
at least one third intermediate conductive element extending directly between a bond pad of the first semiconductor device and a corresponding bond pad of the second semiconductor device.

13. The semiconductor device assembly of claim 12, wherein the carrier comprises a circuit board and the plurality of contacts comprises a plurality of terminals.

14. The semiconductor device assembly of claim 12, wherein edges of the first semiconductor device that are located on opposite sides of the single edge of the first semiconductor device are substantially aligned with edges of the second semiconductor device that are located on opposite sides of the single edge of the second semiconductor device.

15. The semiconductor device assembly of claim 12, wherein:
the at least one first intermediate conductive element includes:
a first end bonded to the bond of the first semiconductor device; and
a second end bonded to the corresponding contact of the carrier; and
the at least one second intermediate conductive element includes:
a first end bonded to the bond of the second semiconductor device;
a second end bonded to the corresponding contact of the carrier; and
an intermediate portion electrically isolated from the first semiconductor device.

16. The semiconductor device assembly of claim 12, wherein each semiconductor device of the plurality of semiconductor devices is a memory device.

17. The semiconductor device assembly of claim 12, wherein the first semiconductor device and the second semiconductor device are memory devices.

18. A memory device, comprising:
a carrier including a plurality of contacts;
a plurality of semiconductor devices, comprising:
a first semiconductor device with bond pads located adjacent to a single edge thereof, the first semiconductor device positioned over the carrier with the bond pads laterally adjacent to the plurality of contacts; and
a second semiconductor device with bond pads located adjacent to a single edge thereof, laterally adjacent to the bond pads of the first semiconductor device, the second semiconductor device superimposed partially over the first semiconductor device, with the bond pads adjacent to the single edge of the first semiconductor device being exposed laterally beyond the single edge of the second semiconductor device;
a plurality of intermediate conductive elements, comprising:
at least one first intermediate conductive element extending directly between a bond pad of the first semiconductor device and a corresponding contact of the carrier;
at least one second intermediate conductive element extending directly between a bond pad of the second semiconductor device and a corresponding contact of the carrier; and
at least one third intermediate conductive element extending directly between a bond pad of the first semiconductor device and a corresponding bond pad of the second semiconductor device;
a protective element over the plurality of semiconductor devices, the plurality of intermediate conductive elements, and at least a portion of the carrier; and
external conductive elements accessible from an exterior of the protective element for enabling communication between components external to the memory device and the plurality of semiconductor devices.

19. The semiconductor device assembly of claim 18, wherein:
the at least one first intermediate conductive element includes:
a first end bonded to the bond of the first semiconductor device; and
a second end bonded to the corresponding contact of the carrier;
the at least one second intermediate conductive element includes:
a first end bonded to the bond of the second semiconductor device;
a second end bonded to the corresponding contact of the carrier; and
an intermediate portion electrically isolated from the first semiconductor device; and
the at least one third intermediate conductive element includes:
a first end bonded to the bond pad of the first semiconductor device; and
a second end bonded to the corresponding bond pad of the second semiconductor device.

20. The memory device of claim 19, wherein the plurality of intermediate conductive elements comprise at least one of bond wires, conductive traces carried upon a flexible dielectric substrate, and leads.

21. The memory device of claim 18, wherein the protective element comprises an encapsulant.

22. A method for assembling an electronic device component, comprising:
connecting a first semiconductor device to a carrier, including:
securing the first semiconductor device to the carrier; and
electrically connecting bond pads carried by an active surface of the first semiconductor device and arranged along a single peripheral edge of the active surface to corresponding contacts of the carrier, including:
bonding first ends of first intermediate conductive elements to the bond pads of the first semiconductor device; and
bonding second ends of the first intermediate conductive elements to the corresponding contacts of the carrier;
connecting a second semiconductor device at least to the carrier, including:
superimposing the second semiconductor device partially over the first semiconductor device, with the bond pads of the first semiconductor device exposed laterally beyond a single peripheral edge of the second semiconductor device;
securing the second semiconductor device to the first semiconductor device with the active surface of the first semiconductor device electrically isolated from a back side of the second semiconductor device; and
electrically connecting bond pads carried by an active surface of the second semiconductor device and arranged along the single peripheral edge of the second semiconductor device to corresponding contacts of the carrier, including:
bonding first ends of second intermediate conductive elements to the bond pads of the second semiconductor device; and bonding second ends of the second intermediate conductive elements to the corresponding contacts of the carrier; and electrically connecting the second semiconductor device to the first semiconductor device by electrically connecting at least one bond pad carried b the active surface of the second semiconductor device and arranged along the single peripheral edge of the second semiconductor device to a corresponding bond pad carried by the active surface of the first semiconductor device and arranged along the single peripheral edge of the first semiconductor device, including:

bonding a first end of at least one third intermediate conductive clement to the at least one bond pad of the second semiconductor device; and bonding a second end of the at least one third intermediate conductive element to the corresponding bond pad of the first semiconductor device.

23. The method of claim 22, further comprising:
providing a protective element over the first semiconductor device, the first intermediate conductive elements, the second semiconductor device, the second intermediate conductive elements, and at least a portion of the carrier.

24. The method of claim 23, further comprising:
providing external conductive elements accessible from an exterior of the protective element and in communication with the contacts of the carrier for enabling communication between components external to the electronic device component and the first and second semiconductor devices.

25. The method of claim 22, wherein connecting the first semiconductor device to the carrier comprises connecting the first semiconductor device to a circuit board.

26. The method of claim 22, wherein connecting the first semiconductor device to the carrier comprises connecting a memory device to the carrier.

27. The method of claim 26, wherein connecting the second semiconductor device to the first semiconductor device comprises connecting another memory device to the first semiconductor device.

28. The method of claim 22, wherein superimposing the second semiconductor device partially over the first semiconductor device comprises arranging the first and second semiconductor devices in a shingle stack.

29. The method of claim 22, wherein superimposing the second semiconductor device partially over the first semiconductor device includes aligning opposite edges of the second semiconductor device that are adjacent to each end of the single peripheral edge of the second semiconductor device with opposite edges of the first semiconductor device that arc adjacent to opposite ends of the single peripheral edge of the first semiconductor device.

30. The method of claim 22, wherein:
electrically connecting the bond pads carried by the active surface of the first semiconductor device and arranged along the single peripheral edge of the first semiconductor device to the corresponding contacts of the carrier includes disposing the first intermediate conductive elements directly between the bond pads of the first semiconductor device and the corresponding contacts of the carrier; and electrically connecting the bond pads carried by the active surface of the second semiconductor device and arranged along the single peripheral edge of the second semiconductor device to the corresponding contacts of the carrier includes disposing the second intermediate conductive elements directly between the bond pads of the second semiconductor device and the corresponding contacts of the carrier.

31. The method of claim 30, wherein electrically connecting the bond pads carried by the active surface of the second semiconductor device and arranged along the single peripheral edge of the second semiconductor device to the corresponding contacts of the carrier comprises electrically isolating an intermediate portion of each second intermediate conductive clement from the first semiconductor device.

32. The method of claim 22, wherein electrically connecting comprises:
bonding first ends of at least one of bond wires, conductive traces carried upon a flexible dielectric substrate, and leads to the bond pads of the first and second semiconductor devices; and bonding second ends of at least one of bond wires, conductive traces carried upon a flexible dielectric substrate, and leads to the corresponding contacts of the carrier.

* * * * *

UNITED STATES PATENT AND TRADEMARK OFFICE
CERTIFICATE OF CORRECTION

PATENT NO.         : 7,998,792 B2                              Page 1 of 1
APPLICATION NO.    : 12/631296
DATED              : August 16, 2011
INVENTOR(S)        : Mess et al.

It is certified that error appears in the above-identified patent and that said Letters Patent is hereby corrected as shown below:

Cover Page, 11th line of ABSTRACT, "formation of stacked mass" should read --formation of a stacked mass--.

Column 1, lines 16-17, delete "of the which".
      Column 6, line 22, delete "drawing".
      Column 7, line 51, "drawing" should read --drawings--.
      Column 8, line 19, "drawing" should read --drawings--.
      Column 8, line 31, "drawing" should read --drawings--.
      Column 8, line 45, "is" should read --are--.
      Column 8, line 52, "drawing" should read --drawings--.
      Column 8, line 55, "drawing" should read --drawings--.
      Column 9, line 39, "drawing" should read --drawings--.
      Column 10, line 22, "drawing" should read --drawings--.
      Column 10, line 52, "is" should read --are--.
      Column 11, line 7, "secured to carrier" should read --secured to said carrier--.
      Column 11, line 67, "shingle" should read --single--.
      Column 15, line 44, "shingle" should read --single--.
      Column 16, line 6, "arc" should read --are--.

Signed and Sealed this
Thirteenth Day of November, 2012

David J. Kappos
*Director of the United States Patent and Trademark Office*